(12) United States Patent
Hashimoto et al.

(10) Patent No.: US 6,753,033 B2
(45) Date of Patent: Jun. 22, 2004

(54) METHOD OF MANUFACTURING CERAMIC THICK-FILM PRINTED CIRCUIT BOARD

(75) Inventors: Akira Hashimoto, Kyoto (JP); Yoshihisa Takase, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 482 days.

(21) Appl. No.: 09/805,442

(22) Filed: Mar. 14, 2001

(65) Prior Publication Data

US 2001/0029665 A1 Oct. 18, 2001

(30) Foreign Application Priority Data

Mar. 16, 2000 (JP) ........................................ 2000-073816

(51) Int. Cl.[7] ................................................ B05D 5/12
(52) U.S. Cl. ........................ 427/96; 427/256; 427/287; 427/383.1; 427/383.5; 427/404
(58) Field of Search ........................ 427/287, 96, 383.1, 427/383.5, 404, 419.1, 256, 299

(56) References Cited

U.S. PATENT DOCUMENTS 4,891,242 A * 1/1990 Ito et al. ........................ 427/96

FOREIGN PATENT DOCUMENTS

EP 671268 * 2/1995

* cited by examiner

*Primary Examiner*—Brian K. Talbot
(74) *Attorney, Agent, or Firm*—McDermott, Will & Emery

(57) ABSTRACT

A method of printing high-quality high-density circuit pattern in a production of a ceramic thick-film printed circuit board. The method comprises forming a resin layer for prevention of sagging on a substrate before printing the circuit pattern. The present invention provides conditions optimizing materials, thickness, surface roughness, printing conditions and firing conditions of the resin layer. According to the manufacturing method of the present invention, a ceramic thick-film printed circuit board densely printed with a satisfactory printed pattern and free of problems such as film exfoliation, deformation of the pattern, pinholes and the like can readily be obtained.

10 Claims, 3 Drawing Sheets

METHOD OF MANUFACTURING CERAMIC THICK-FILM PRINTED CIRCUIT BOARD

FIELD OF THE INVENTION

The present invention relates to a method of manufacturing a ceramic thick-film printed circuit board, the method which is intended for improvement of printing accuracy by preventing sagging in a printing process for the ceramic thick-film circuit board production.

BACKGROUND OF THE INVENTION

Recently, reduction in size and weight of electronic components is demanded, arising from the need for their use in cellular telephones and compact office automation equipment. Owing to multi-layering such as a green sheet laminating method or the like, a ceramic thick-film printed circuit board in particular meets the demand for its use for a high-density printed circuit board such as a microchip module (MCM) or a chip size packaging (CSP).

Even in the chip components industry, multi-layering as can be seen in chip capacitors and chip inductors has been employed as the mainstream to meet miniaturization of chip components. Moreover, in the case of chip resistors and the like, the use of high-resolution screen masks and the introduction of paste of good printability in a screen printing process encourage fine printing.

Furthermore, the manufacture of chip components utilizing an intaglio transfer printing technique which is acceptable for fine printing is also commercially practical.

In the case of the manufacture of such a high-density printed circuit board, the multi-layering requires a many cycles of printings. Besides, the number of times an intaglio is used is limited in the intaglio transfer printing technique, so that cost for such materials as intaglios to be used has increased.

The present invention provides a method of manufacturing a printed circuit board, realizing improvement of printed wiring density by preventing printing paste sagging through the formation of an anti-sagging layer on the surface of a substrate prior to a printing step for a ceramic thick-film printed circuit board production.

In a conventional process of manufacturing a thick-film printed circuit board, sagging of the paste during or after printing has caused limitation on the wiring density. For this reason, in cases where an alumina substrate is used as the substrate, a printed pattern with a line width of 100 $\mu$m has required a spacing of about 70 to 80 $\mu$m. Paste, which readily sags, particularly has required a spacing of 100 $\mu$m or more. There is one method proposed as a measure against paste sagging. According to the method, an anti-sagging layer (hereinafter referred to as resin layer) mainly consisting of an organic binder contained in the printing paste is formed on an object to be printied before printing, so that the resin layer absorbs a solvent contained in the paste, thereby increasing viscosity of the paste and preventing the paste from sagging.

The conventional printing process utilizing the resin layer is explained hereinafter with reference to FIGS. 2A–2D and 3A–3D. First, with reference to FIG. 2A, there is explained a method of forming a resin layer by screen printing generally employed as a resin layer forming method.

Ethyl cellulose generally used as an organic binder contained in printing paste is used as a material for a resin layer as shown in FIG. 2A. Ethyl cellulose is dissolved in a solvent such as α-terpineol or the like at a concentration of about 10 wt % to form a anti-sagging paste for use. The anti-sagging paste 23 is placed on screen mask 22 in a manner as shown in FIG. 2A.

Subsequently, anti-sagging paste 23 is printed, using squeegee 24, to form a resin layer on ceramic substrate 21, an object to be printed. FIG. 2B illustrates resin layer 25 being formed on ceramic substrate 21. Here, there has been a problem of mesh marks remaining on the substrate due to poor leveling of paste 23.

Thereafter, as shown in FIG. 2C, printed layers 26 are formed on resin layer 25 by screen printing. Here, depending on the sizes of mesh marks on resin layer 25, there have been cases where a printed pattern has blurred after the printing, thus forming short circuit portion 27, as shown in FIG. 2D.

As a method for preventing the mesh marks remaining on resin layer 25, reducing a viscosity of paste 23 can be conceivably. In this case, however, resin layer 25 per se readily extends off ceramic substrate 21, so that an printing area of resin layer 25 on the substrate has to be reduced.

Problems of the resin layer that arise in the conventional printing process are explained next with reference to FIGS. 3A–3D.

In a case where paste 33 is printed, using screen mask 32 as shown in FIG. 3A, a screen mask of 250 mesh or more is used. In this case, resin layer 35 has a thickness of 4 $\mu$m or more when dried.

Subsequently, as shown in FIG. 3B, printed layer 36 is formed on resin layer 35 on ceramic substrate 31. Thereafter, during printed layer 36 is fired, resin layer 35, which is an organic substance, burns out as shown in FIG. 3C, and only fired film 37 is formed. However, when printed layer 36 is formed on resin layer 35 having a thickness of 5 $\mu$m or more and then fired, fired film 37 forms film exfoliation 38 as shown in FIG. 3D at its edge.

To reduce the resin layer in thickness to meet against the above problem, when a screen mask as fine as 325 mesh or more is used for printing paste 33, there has been a problem that the mask poorly peels off, thereby producing bumpy surface of resin layer 35 formed.

As described above, the conventional method has had a great many problems connected with the formation of the resin layer intended for the prevention of sagging as well as with the formation of good-quality printed layers.

In other words, the condition of the printed pattern and the appearance thereof after firing have varied according to the molecular weight of ethyl cellulose in the paste for the resin layer, thickness of the resin layer, thickness of the printed pattern and resin layer forming methods, and depending on these conditions, there have arose problems.

The molecular weight of ethyl cellulose to be used for the resin layer particularly exerts a great influence. The fired pattern forms film exfoliation or become deformed unless the thickness of the resin layer is controlled according to the molecular weight. Moreover, the printed pattern may exfoliate in the course of firing unless the molecular weight of ethyl cellulose and the thickness of the resin layer as well as a temperature rising rate are optimally controlled. Furthermore, cracks have formed in the printed pattern, in a case a solvent content of the printing paste is not properly controlled.

In addition, depending on surface roughness of the resin layer, the printed layer may have pinholes or blur.

The present invention aims to provide a method of manufacturing a high-density printed circuit board of good quality. The method optimizes the conditions for formation of a resin layer, a printing step and a firing step on the processes of the manufacturing a ceramic thick-film printed circuit board.

SUMMARY OF THE INVENTION

The present invention provides a method of making high-density printing of high quality in a process of manufacture a ceramic thick-film printed circuit board. The method includes forming a resin layer on a substrate before printing process and subsequently printing a pattern on the resin layer. The present invention provides conditions optimizing material for the resin layer, thickness of the resin layer, surface condition thereof, printing conditions and firing conditions.

According to the manufacturing method of the present invention, a printed circuit board densely printed with a satisfactory printed pattern can readily be obtained. The printed pattern is free of problems such as film exfoliation after firing, deformation of the pattern and pinholes.

DESCRIPTION OF THE PREFERRED EMBODIMENT

An exemplary embodiment of the present invention is explained hereinafter with reference to FIGS. 1A–1D.

FIGS. 1A–1D partly illustrates a step of forming a resin layer prior to a printing step of a ceramic thick-film printed circuit board.

Figure 1A:
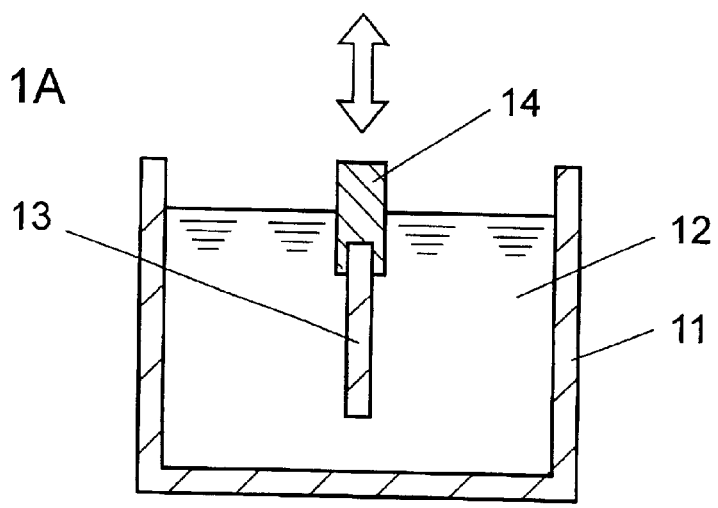
FIGS. 1A–1D show sectional views illustrating a process of manufacturing a ceramic thick-film printed circuit board in accordance with one embodiment of the present invention.
Figure 1B:
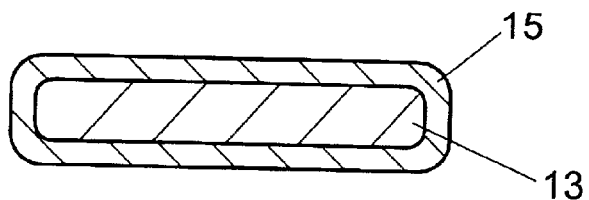

An explanation of FIG. 1A is given first. Solution 12 made by dissolving 3 to 20% ethyl cellulose to be used for resin layer 15 in a mixed solvent consisting of acetone and toluene is poured into container 11. Subsequently, ceramic substrate 13 is secured to an end face of fixing jig 14 and then entirely immersed in solution 12 at a slow pace. After a lapse of about 10 seconds, substrate 13 is slowly raised therefrom. The thickness of the resin layer can be adjusted according to the raising velocity. Substrate 13 is then dried without further heating for about 10 minutes. Thus, as shown in FIG. 1B, dried resin layer 15 is formed on the surface of substrate 13.

In the present embodiment, the dried thickness of resin layer 15 is controlled to be within a range of 0.15 to 2 $\mu$m by controlling the concentration of ethyl cellulose in solution 12 and the raising speed.

In the present embodiment, an alumina substrate having an alumina content of 96 wt % and an average surface roughness (Ra) in the range of 0.2 to 0.5 $\mu$m or a maximum surface roughness (Rmax) in the range of 2 to 5 $\mu$m is used as ceramic substrate 13. The surface roughness mentioned herein is defined in Japanese Industrial Standards (JIS) B0601.

Through the use of the above-mentioned ceramic substrate, resin layer 15 with an Ra of 0.1 to 0.5 $\mu$m or an Rmax on of 1 to 5 $\mu$m can be obtained. According to the results of a study conducted by the present inventors, with a resin layer having an Ra ranging from 0.15 to 0.5 $\mu$m or an Rmax ranging from 1.5 to 5 $\mu$m, satisfactory printed paint film 16 forming a printed pattern free of pinholes and blur is formable.

Even in cases where any substrate other than the ceramic substrate having the above-mentioned surface roughness is used, satisfactory printed layer 16 free of pinholes and blur is formable under the following conditions: Resin layer 15 has surface roughness close to the above-described ranges, e.g., Ra of 0.1 $\mu$m or less or Rmax of 1 $\mu$m or less, and an emulsion surface of a screen mask having Ra in the range of 0.25 to 0.5 $\mu$m or Rmax in the range of 2 to 5 $\mu$m is used in a subsequent printing step.

Figure 1C:
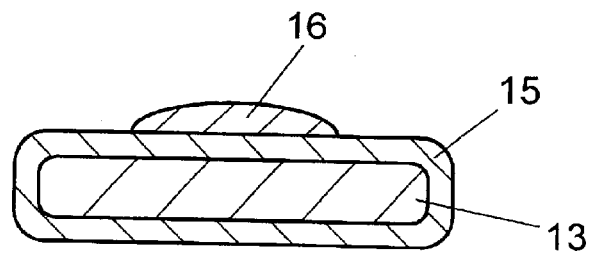

Next, as shown in FIG. 1C, printed layer 16 is formed on resin layer 15 by screen printing. Satisfactory printed layer 16 free of cracks can be obtained by controlling a solvent content of paste for the formation of printed layer 16 to within a range of 8 to 25 wt %. It is preferable that the thickness of printed layer 16 is such that the thickness of fired film 17 is controlled to within a range of 5 to 22 $\mu$m after one-time printing or overprinting. With printed layer 16 having a thickness controlled as described above, fired paint film 17 does not exfoliate.

Figure 1D:
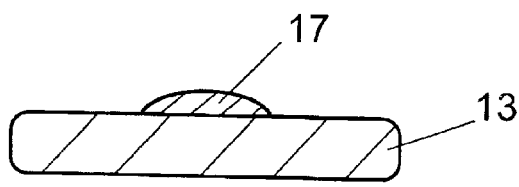
Figure 2A:
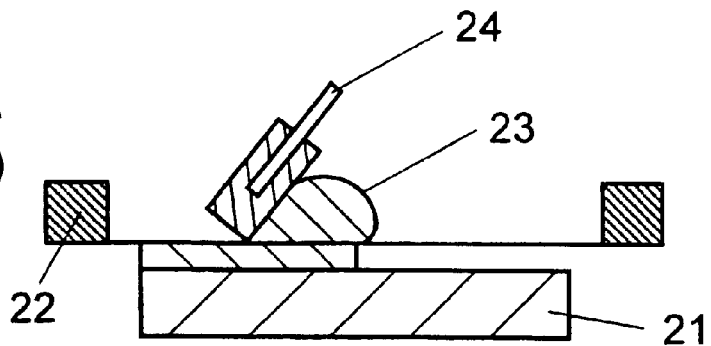
FIGS. 2A–2D show sectional views illustrating a conventional process of manufacturing a thick-film printed circuit board.
Figure 2B:
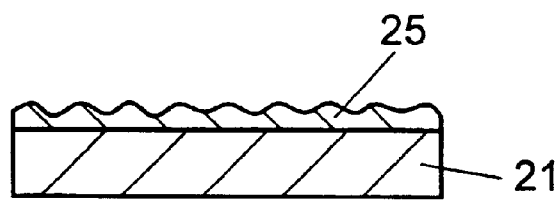
Figure 2C:
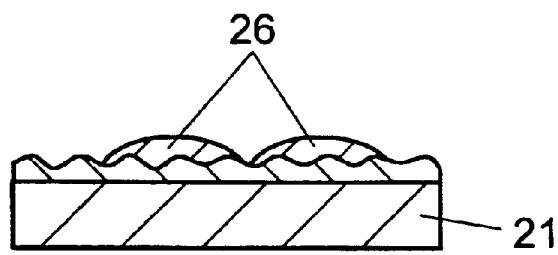
Figure 2D:
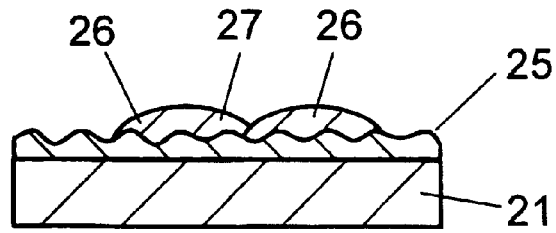
Figure 3A:
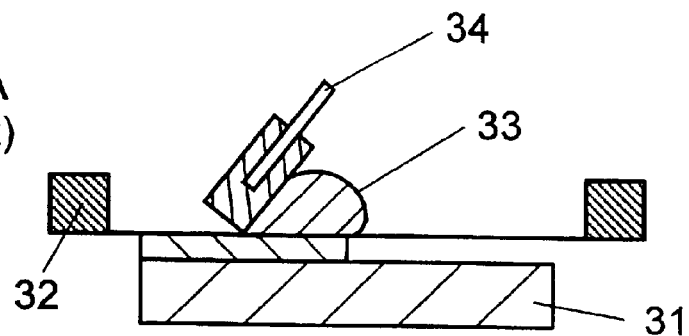
FIGS. 3A–3D show sectional views illustrating another conventional process of manufacturing a thick-film printed circuit board.
Figure 3B:
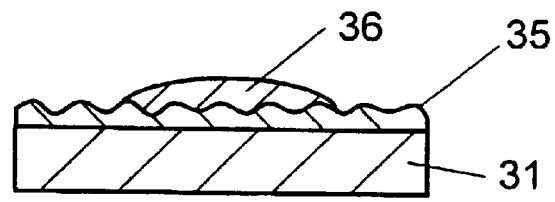
Figure 3C:
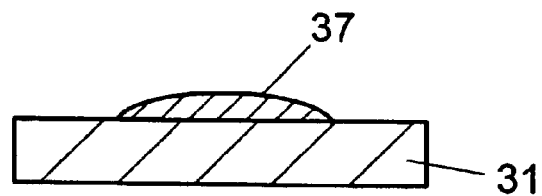
Figure 3D:
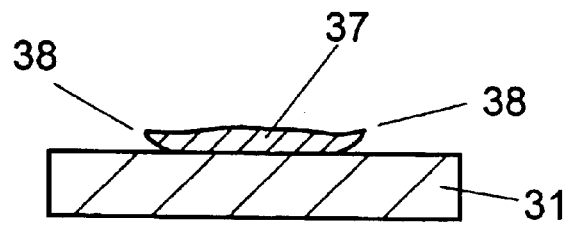

When subsequently fired in a furnace, resin layer 15 burns out as shown in FIG. 1D, and fired film 17 is formed on substrate 13.

A fired film free of exfoliation can be formed by firing a printed layer formed under the above-described printing conditions in a firing step in which a temperature rasing rate is controlled to within a range of 80 to 150° C./min. The following examples further illustrate the present invention in detail.

EXAMPLE 1

Example 1 is explained hereinafter with reference to FIGS. 1A–1D. First, an explanation of materials to be used is given.

The ceramic substrate 13 is formed by a doctor blade method, extrusion molding, roll compaction or the like. The substrate 13 also has Ra ranging from 0.2 to 0.5 $\mu$m or Rmax ranging from 2 to 5 $\mu$m. An alumina substrate, a forsterite substrate, a ferrite substrate, a dielectric substrate of every kind, a low-temperature fired substrate or the like is used as ceramic substrate 13. Any substrate other than the above is usable in the present invention provided that it can withstand firing conditions of the printed layer.

Examples of material for resin layer 15 include ethyl cellulose, butyral resin, derivatives thereof, acrylic resin, polystyrene resin and the like. Ethyl cellulose is used as an organic vehicle contained in printing paste, while butyral resin is used for forming a ceramic green sheet or the like. These materials burn out when fired.

The resin such as ethyl cellulose, butyral resin or the like is dissolved in a solvent such as acetone or toluene in an amount ranging from 3 to 20 wt %. In cases where acetone and toluene are used, they are normally mixed in such as 33 to 67 wt % acetone and 33 to 67 wt % toluene. The mixing ratio may be changed to control volatility of the solvent contained in the printed layer, thus conditioning the film for favorable drying condition and ease of handling during the work.

In the present example, solution 12 made by dissolving ethyl cellulose in a solvent with an acetone-to-toluene ratio of 67 to 33 is used. Ethyl cellulose in particular undergoes manufacturer's classification by molecular weight for sale. Accordingly, in the present example, four types of ethyl cellulose, namely, N-4, N-50, N-100 and N-200, produced by Hercules Incorporated are employed for evaluation and examination. These four product numbers are classified according to solution viscosity, and the solution viscosity directly related to the molecular weight.

Thus, solutions 12 having an N-4 content of 15 to 20 wt %, an N-50 content of 6 to 10 wt %, an N-100 content of 2 to 6 wt % and an N-200 content of 1 to 3 wt %, respectively, are used.

Ceramic substrate 13 is attached to fixing jig 14 and then slowly immersed in vessel 11 containing solution 12. When a portion of ceramic substrate 13 on which a printed pattern is to be formed is immersed, it is held still for about 10 seconds, and ceramic substrate 13 is then raised from the solution at a constant speed. The thickness of resin layer 15 in dried film can be adjusted according to this raising speed.

In the present example, as shown in Table 1, the four grades of ethyl cellulose are used for resin layers 15, and resin layers 15 having respective thickness ranging from 0.1 to 5 $\mu$m are formed for evaluation. The results are shown in Table 1.

As shown in FIG. 1B, ceramic substrate 13 entirely raised from solution 12 has resin layer 15 formed on its surface. This resin layer 15 dries after room temperature keeping for about 10 minutes. This resin layer can undergo printing as is. However, adhesion of resin layer 15 to ceramic substrate 13 improves when the resin layer undergoes forced drying at a temperature of about 150° C. for approximately 10 minutes.

Subsequently, as shown in FIG. 1C, Ag/Pd paste is used for printing a pattern on resin layer 15 by screen printing and then dried at 120 to 150° C. for 5 to 10 minutes, thus forming printed layer 16. The printed layer 16 does not blur, thus permitting extremely sharp printing. In the present example, the thickness of the fired film is controlled to within a range of 5 to 16 $\mu$m.

Next, substrate 13 having printed layer 16 formed thereon is fired at a temperature increasing rate between 50 and 80° C./min and at a peak temperature between 830 and 870° C. for 5 to 10 minutes, and satisfactory fired film 17 free of sagging can thus be formed.

An explanation of the results shown in Table 1 is as follows. It should be noted that effects vary with grades of ethyl cellulose. In the case of the four grades used, generally speaking, resin layers 15 having respective thickness of not more than 0.1 $\mu$m yield an insufficient effect and each cause a blur of 5 $\mu$m on one side of the printed pattern. When the resin layers have respective thickness of 3 $\mu$m or more, some fired films 17 have deformed printed patterns, and some fired films 17 form film exfoliations.

To make resin layers 15 effective, using the four grades of ethyl cellulose shown in Table 1, it is desirable that the thickness of each resin layer be controlled to within a range of 0.15 to 2 $\mu$m. In cases where the grades of ethyl cellulose are N-50 and N-100, resin layers 15 can each have an extended thickness range of about 0.15 to 3 $\mu$m. Though, the present example has used ethyl cellulose, the similar results can be obtained even in the case of butyral resin when tested in the same manner as in the case of ethyl cellulose when resin layers 15 have respective thickness ranging from 0.15 to 2 $\mu$m. The same results can also be obtained when Ag, Ag/Pt paste, glass paste or the like is used for printed film 16.

EXAMPLE 2

Evaluation results on influence of temperature increasing rates on respective fired films 17 during firing of respective printed layers 16 of Example 1 are discussed hereinafter.

As shown in Table 2, an evaluation is performed on the four grades of ethyl cellulose with temperature increasing rates ranging from 30 to 200° C./min during firing. As a result of the evaluation, satisfactory fired films can be obtained through the use of the four grades of ethyl cellulose when the temperature increasing rates ranges from 80 to 120° C./min during firing. In other words, fired films 17 form a deformed pattern through the use of N-4 when the temperature increasing rate is 50° C./min or less, and fired films 17 form film exfoliations through the use of N-200 when the temperature increasing rate is 150° C./min or more.

As is clear from the above results, the change of the grade (molecular weight) of ethyl cellulose can meet the change of the temperature increasing rate during firing. N-4 and N-50 in particular are adaptable to high temperature programming rates in a fast-firing furnace.

EXAMPLE 3

Evaluation results on fired films 17 of Example 1 that have respective thickness ranging from 5 to 37 $\mu$m are shown in Table 3.

The four grades of ethyl cellulose for resin layers 15 are evaluated. Satisfactory fired films 17 can be obtained through the use of these four grades of ethyl cellulose when their respective thickness range from 5 to 22 $\mu$m. In other words, fired films 17 form a deformed printed pattern through the use of N-4 when their respective thickness are 30 $\mu$m or more. Through the use of N-50, fired film 17 forms a deformed printed pattern when its thickness is 37 $\mu$m or more, and through the use of N-100, fired film 17 forms film exfoliation when its thickness is 37 $\mu$m or more. Moreover, through the use of N-200, fired films 17 form film exfoliation when their respective thickness are 30 $\mu$m or more.

As is clear from the above results, to obtain satisfactory fired film 17, the thickness range of the fired film needs to be adjusted according to the grade of ethyl cellulose to be used for resin layer 15. Conversely, the grade of ethyl cellulose can be selected in accordance with the required thickness.

EXAMPLE 4

An evaluation is performed on printed layer 16 of Example 1 using printing pastes having respective solvent contents ranging from 8 to 35 wt %. The four grades of ethyl cellulose for resin layers 15 are evaluated. The results are shown in Table 4.

Satisfactory printed layer 16 can be obtained through the use of the four grades of ethyl cellulose when respective pastes having solvent contents ranging from 8 to 25 wt % is used. In other words, dried printed layers 16 have cracks through the use of N-4 and N-50 when respective pastes have solvent contents of 35 wt % or more, and through the use of N-100 and N-200, dried printed layers 16 also have cracks when respective pastes have solvent contents of 29 wt % or more.

As is clear from the above, to obtain satisfactory printed layer 16, the solvent content range of the printing paste needs to be adjusted according to the grade of ethyl cellulose to be used for resin layer 15.

EXAMPLE 5

Influence of respective surface roughness of resin layers 15 of Example 1 is examined. Specifically, as shown in Table 5, the respective influences of Ra ranging from 0.08 to 0.87 μm and corresponding Rmax ranging from 1 to 7.84 μm on respective conditions of printed layers 16 are examined.

As a result of the examination, satisfactory printed layers 16 can be obtained when resin layers 15 have respective Ra ranging from 0.15 to 0.54 μm (respective Rmax ranging from 1.25 to 5.76 μm).

In the case of Ra of 0.08 μm or Rmax of 1.00 μm, either of which falls outside the above range, printed layer 16 has pinholes, and a pattern blurs. In other words, when the resin layer is too flat, no satisfactory printed layer can be obtained.

The conceivable reason is as follows. In cases where the surface of resin layer 15 and the emulsion surface of the printing screen mask are both flat and having excellent contact, air within a space of a pattern portion of a screen mask emulsion cannot escape therefrom (has no loophole) when the printing paste is extruded by a squeegee during printing. Consequently, air remains in pinhole form within printed layer 16, or the paste creeps out from a portion where the emulsion of the screen mask poorly contacts to resin layer 15.

In the case of Ra of 0.87 μm or Rmax of 7.84 μm, either of which also falls outside the above-mentioned range, a blur of the paste exceeds 5 μm on one side of the pattern. It is thus been confirmed that the resin layer has an optimum surface roughness range.

EXAMPLE 6

Influence of surface roughness of the emulsion surface of the screen mask of Example 5 to be used for printing the printed layer 16 is examined. Specifically, influences of the screen masks having Ra ranging from 0.07 to 0.67 μm or Rmax ranging from 0.98 to 6.94 μm are examined. The results are shown in Table 6.

In the case of resin layers 15 each having an Ra of 0.06 μm (Rmax of 0.77 μm), satisfactory printed paint films 16 can be obtained when the screen masks having Ra ranging from 0.25 to 0.55 μm (respective Rmax ranging from 1.99 to 5.46 μm) are used. When the surface roughness of the screen mask is too small, printed layer 16 has pinholes, and when the surface roughness is too large, the printed pattern has a blur of 5 μm or more on its side.

In each of the foregoing examples, the material for resin layer 15, like that of FIG. 1B, has been exclusively ethyl cellulose. However, the same effects can be obtained even in the case of butyral resin. Moreover, printed layer 16 and fired film 17 are affected by the grade of ethyl cellulose, so that control of conditions required of them to within optimum ranges allows resin layer 15 to exert its sufficient effect.

As described above, according to the present invention, the formation of the resin layer under the optimum conditions prior to the printing step for the ceramic thick-film printed circuit board results in, in addition to an anti-sagging effect, a satisfactory printed layer free of problems such as blur, pinholes, film exfoliation during firing and deformation of the printed pattern.

TABLE 1

APPEARANCES OF FIRED FILMS
Relationship between molecular weight of ETHYL CELLULOSE and thickness of resin layer

| Grade of ETHYL CELLULOSE | Molecular weight of ETHYL CELLULOSE | Thickness of resin layer(μm) | | | | | |
|---|---|---|---|---|---|---|---|
| | | 0.10 | 0.15 | 1.0 | 2.0 | 3.0 | 5.0 |
| N-4 | 14,000 | X | O | O | O | FE | FE |
| N-50 | 56,000 | X | O | O | O | O | FE |
| N-100 | 68,000 | X | O | O | O | O | D |
| N-200 | 81,000 | X | O | O | O | D | D |

O: satisfactory
X: a blur of 5 μm or more on one side of a printed pattern
FE: film exfoliation
D: deformation of a printed pattern
Firing conditions: temperature increasing rates 50 to 80° C./min, peak temperatures 840 to 870° C. for 5 to 12 minutes
Thickness of each printed pattern fired: 5 to 16 μm

TABLE 2

APPEARANCES OF FIRED FILMS
Relationship between molecular weight of ETHYL CELLULOSE and temperature increasing rate

| Grade of ETHYL CELLULOSE | Molecular weight of ETHYL CELLULOSE | Temperature increasing rate (° C./min) | | | | | |
|---|---|---|---|---|---|---|---|
| | | 30 | 50 | 80 | 120 | 150 | 200 |
| N-4 | 14,000 | D | D | O | O | O | O |
| N-50 | 56,000 | O | O | O | O | O | O |

TABLE 2-continued

APPEARANCES OF FIRED FILMS
Relationship between molecular weight of ETHYL CELLULOSE
and temperature increasing rate

| Grade of ETHYL CELLULOSE | Molecular weight of ETHYL CELLULOSE | Temperature increasing rate (° C./min) | | | | | |
|---|---|---|---|---|---|---|---|
| | | 30 | 50 | 80 | 120 | 150 | 200 |
| N-100 | 68,000 | O | O | O | O | O | FE |
| N-200 | 81,000 | O | O | O | O | FE | FE |

O: satisfactory
FE: film exfoliation
D: deformation of a printed pattern
Thickness of resin layer: 0.5 to 2 μm
Thickness of fired film: 5 to 16 μm
Firing condition: peak temperatures 840 to 870° C. for 5 to 12 minutes

TABLE 3

APPEARANCES OF FIRED FILMS
Relationship between molecular weight of ETHYL CELLULOSE
and fired thickness

| Grade of ETHYL CELLULOSE | Molecular weight of ETHYL CELLULOSE | Fired thickness (μm) | | | | | |
|---|---|---|---|---|---|---|---|
| | | 5 | 8 | 16 | 22 | 30 | 37 |
| N-4 | 14,000 | O | O | O | O | D | D |
| N-50 | 56,000 | O | O | O | O | O | D |
| N-100 | 68,000 | O | O | O | O | O | FE |
| N-200 | 81,000 | O | O | O | O | FE | FE |

O: satisfactory
FE: film exfoliation
D: deformation of a printed pattern
Thickness of each resin layer: 0.5 to 2 μm
Firing conditions: temperature increasing rates 50 to 80° C./min, peak temperatures 840 to 870° C. for 5 to 12 minutes

TABLE 4

APPEARANCES OF PRINTED LAYERS
Relationship between molecular weight of ETHYL CELLULOSE
and solvent content of printing paste

| PRODUCT NUMBER OF ETHYL CELLULOSE | MOLECULAR WEIGHT OF ETHYL CELLULOSE | SOLVENT CONTENT (wt %) OF PRINTING PASTE | | | | | |
|---|---|---|---|---|---|---|---|
| | | 8 | 12 | 15 | 25 | 29 | 35 |
| N-4 | 14,000 | O | O | O | O | O | C |
| N-50 | 56,000 | O | O | O | O | O | C |
| N-100 | 68,000 | O | O | O | O | C | C |
| N-200 | 81,000 | O | O | O | O | C | C |

O: satisfactory
C: cracks in a pattern
Thickness of resin layer: 0.5 to 2 μm
Thickness of each printed pattern fired: 5 to 16 μm
Firing conditions: temperature increasing rates 50 to 80° C./min, peak temperatures 840 to 870° C. for 5 to 12 minutes

TABLE 5

APPEARANCES OF PRINTED LAYERS AND SURFACE
ROUGHNESSES OF RESIN LAYERS

| Surface roughness | Ra | 0.08 | 0.15 | 0.23 | 0.32 | 0.54 | 0.87 |
|---|---|---|---|---|---|---|---|
| | Rmax | 1.00 | 1.25 | 2.46 | 3.35 | 5.76 | 7.84 |
| Appearance | | NG | O | O | O | O | NG |

O: satisfactory
NG: a blur of 5 μm or more on one side of a pattern, or pinholes
Material for resin layer: N-50
Thickness of resin layer: 0.5 to 2 μm
Firing conditions: temperature increasing rates 50 to 80° C./min, peak temperatures 840 to 870° C. for 5 to 12 minutes
Screen mask: ST500CAL (produced by Tokyo Process Service Co., Ltd.) with an emulsion thickness of 15 μm and treated with emulsion flattening

TABLE 6

APPEARANCES OF PRINTED LAYERS AND SURFACE
ROUGHNESSES OF EMULSIONS OF SCREEN MASKS

| Surface roughness | Ra | 0.07 | 0.12 | 0.25 | 0.34 | 0.55 | 0.67 |
|---|---|---|---|---|---|---|---|
| | Rmax | 0.98 | 1.33 | 1.99 | 3.58 | 5.46 | 6.94 |
| Appearance | | NG | NG | O | O | O | NG |

O: satisfactory
NG: a blur of 5 μm or more on one side of a pattern, or pinholes
Thickness of each fired film: 5 to 16 μm
Material for resin layer: N-50
Thickness of resin layer: 1 to 2 μm (Ra of 0.06, Rmax of 0.77)
Firing Conditions: temperature increasing rates 50 to 80° C./min, peak temperatures 840 to 870° C. for 5 to 12 minutes
Screen mask: ST500CAL (emulsion thickness 20 μm)

What is claimed is:

1. A method of manufacturing a ceramic thick-film printed circuit board, comprising the steps of:
   forming a layer comprising a resin having a thickness ranging from 0.15 to 2 μm on a substrate;
   forming a printed pattern on said layer; and
   firing the printed pattern positioned on said layer.

2. The method of manufacturing a ceramic thick-film printed circuit board of claim 1, wherein the thickness of the layer is controlled by a mixing ratio of resins having a same chemical structure and different molecular weights.

3. The method of manufacturing a ceramic thick-film printed circuit board of claim 1, wherein a temperature increasing rate ranges from 80 to 120° C./min in the firing step.

4. The method of manufacturing a ceramic thick-film printed circuit board of claim 3, wherein the temperature increasing rate is adjusted according to a molecular weight of the resin.

5. The method of manufacturing a ceramic thick-film printed circuit board of claim 1, wherein a fired film has a thickness ranging from 5 to 22 μm.

6. The method of manufacturing a ceramic thick-film printed circuit board of claim 5, wherein the thickness of the fired film is adjusted according to a molecular weight of a binder resin contained in a printing paste.

7. The method of manufacturing a ceramic thick-film printed circuit board of claim 1, wherein a printing paste having a solvent content ranging from 8 to 25 wt % is used in the printed pattern forming step.

8. The method of manufacturing a ceramic thick-film printed circuit board of claim 7, wherein the solvent content of the printing paste is adjusted according to a molecular weight of the resin.

9. The method of manufacturing a ceramic thick-film printed circuit board of claim 1, wherein the resin layer has an average surface roughness Ra ranging from 0.15 to 0.5 μm or a maximum surface roughness Rmax ranging from 1.5 to 5 μm according to a measuring method of Japanese Industrial Standards (JIS)B0601.

10. The method of manufacturing a ceramic thick-film printed circuit board of claim 1, wherein one of the resin layer and an emulsion of a screen mask used in the printed pattern forming step has an average surface roughness Ra ranging from 0.25 to 0.5 μm or a maximum surface roughness Rmax ranging from 2 to 5 μm.

* * * * *